United States Patent
Kida et al.

(10) Patent No.: US 7,320,924 B2
(45) Date of Patent: Jan. 22, 2008

(54) METHOD OF PRODUCING A CHIP-TYPE SOLID ELECTROLYTIC CAPACITOR

(75) Inventors: Fumio Kida, Toyama (JP); Makoto Nakano, Toyama (JP)

(73) Assignees: NEC TOKIN Corporation, Sendai-shi (JP); NEC TOKIN Toyama, Ltd., Toyama (JP)

( * ) Notice: Subject to any disclaimer, the term of this patent is extended or adjusted under 35 U.S.C. 154(b) by 0 days.

(21) Appl. No.: 11/523,417

(22) Filed: Sep. 19, 2006

(65) Prior Publication Data

US 2007/0020843 A1     Jan. 25, 2007

Related U.S. Application Data

(62) Division of application No. 10/866,154, filed on Jun. 10, 2004, now Pat. No. 7,138,713.

(30) Foreign Application Priority Data

Jun. 16, 2003   (JP)   ............... 2003-170428

(51) Int. Cl.
    *H01L 21/20* (2006.01)
(52) U.S. Cl. ............. 438/396; 438/381; 438/397; 438/398; 257/E21.008; 257/E21.011; 257/E21.017
(58) Field of Classification Search ............... 438/381, 438/396, 397, 398; 257/E21.008, E21.011, 257/E21.017
    See application file for complete search history.

(56) References Cited

U.S. PATENT DOCUMENTS

| 5,198,967 A | 3/1993 | Kuranuki et al. |
| 6,343,004 B1 * | 1/2002 | Kuranuki et al. ........... 361/523 |
| 6,343,044 B1 | 1/2002 | Hsu et al. |

FOREIGN PATENT DOCUMENTS

| JP | 2001-284192 A | 10/2001 |
| JP | 2004-363526 A | 12/2004 |
| KR | 10-0191759 B1 | 6/1999 |

* cited by examiner

Primary Examiner—Matthew Smith
Assistant Examiner—Thanh Van Pham
(74) Attorney, Agent, or Firm—Frishauf, Holtz, Goodman & Chick, P.C.

(57) ABSTRACT

A chip-type solid electrolytic capacitor comprises capacitor elements. A cathode terminal comprising a plate-like conductor is interposed between cathode layers of the capacitor elements. The capacitor elements are bonded to each other by a bonding agent such as a solder or a conductive adhesive. The cathode terminal is provided with a through hole formed at a portion to be brought into contact with each of the capacitor elements. Bonding surfaces of the capacitor elements are directly connected at the through hole.

4 Claims, 7 Drawing Sheets

METHOD OF PRODUCING A CHIP-TYPE SOLID ELECTROLYTIC CAPACITOR

This application is a Divisional Application of U.S. patent application Ser. No. 10/866,154, filed Jun. 10, 2004 now U.S. Pat. No. 7,138,713, which claims the priority of Japanese Application JP 2003-170428, the entire contents of which are incorporated herein by reference.

BACKGROUND OF THE INVENTION

This invention relates to a chip-type solid electrolytic capacitor using a sintered body of a valve metal as an anode member and a method of producing the same and, in particular, to a chip-type solid electrolytic capacitor having a large capacity and a low equivalent series resistance (hereinafter abbreviated to ESR) and a method of producing the same.

In a solid electrolytic capacitor, an oxide layer obtained by electrolytic oxidation of an anode member is used as a dielectric member. The anode member comprises a sintered body of a so-called valve metal, such as aluminum, tantalum, niobium, titanium, hafnium, and zirconium, allowing formation of the oxide layer which is dense and highly insulative.

Typically, the solid electrolytic capacitor mentioned above is produced by a method comprising steps of forming an oxide layer by electrochemical anodic oxidation of a sintered body of a valve metal to serve as an anode member, forming a cathode layer and attaching a cathode terminal thereto, and attaching an anode terminal to an anode lead, thereby obtaining the capacitor For example, manganese dioxide is used as the cathode layer. In order to further improve the frequency characteristic, development is made of a solid electrolytic capacitor in which a conductive polymer is used as the cathode layer so as to reduce the ESR.

Referring to FIGS. 1A and 1B, a typical conventional chip-type solid electrolytic capacitor will be described. As shown in FIGS. 1A and 1B, the solid electrolytic capacitor comprises a capacitor element 1, an anode lead 2, a cathode terminal 3, and an anode terminal 6. The capacitor element 1 comprises an anode member 7, an oxide layer 8, and a cathode layer 9. The anode lead 2 is extracted from the anode member 7. The above-mentioned components are enclosed in an encapsulating resin 10 formed by resin molding.

As illustrated in FIG. 1A, the anode lead 2 is insulated from the cathode layer 9 by the oxide layer 8. As illustrated in FIG. 1B, the cathode terminal 3 and the anode terminal 6 are generally formed into shapes along the encapsulating resin 10 so as to be adapted to surface mounting.

The chip-type solid electrolytic capacitor having such a structure suitable for surface mounting is small in size, large in capacitance, and excellent in frequency characteristic and is widely used in a power supply circuit of a CPU and the like. However, as an operation frequency of the CPU becomes higher, there is an increasing demand for an improvement in noise characteristic of the power supply circuit as well as an increase in allowable ripple current. As a consequence, a capacitor further lowered in ESR is required.

Further, an apparatus to which the CPU is mounted is under development towards a smaller size and an advanced function. Accordingly, it is necessary to simultaneously satisfy not only the demand for a lower ESR but also the demand for a small size, a large capacitance, and a thin profile.

Generally, if a plurality of capacitors are connected in parallel, a total capacitance ($C_{total}$) and a total ESR ($ESR_{total}$) are given by:

$$C_{total} = C_1 + C_2 + \ldots + C_n \quad (1)$$

$$1/ESR_{total} = 1/ESR_1 + 1/ESR_2 + \ldots + 1/ESR_n \quad (2)$$

Herein, $C_i$ and $ESR_i$ represent the capacitance and the ESR of an i-th (i being a natural number between 1 and n) capacitor, respectively.

Therefore, by connecting a plurality of capacitor elements having the shape illustrated in FIG. 1A in parallel, the capacitance will be increased and the ESR will be reduced. This also applies to the case where the solid electrolytic capacitor is operated as a transmission-line noise filter.

Japanese Patent Application Publication No. 2001-284192 (Reference 1) discloses a first conventional technique of connecting a plurality of capacitor elements in parallel. Specifically, anode leads of a plurality of capacitor elements having the structure illustrated in FIG. 1A are connected to an anode terminal comprising a lead frame. A cathode layer of at least one capacitor element is connected to a cathode terminal comprising a lead frame.

Referring to FIG. 2, connection of a plurality of capacitor elements disclosed in Reference 1 will be described. In the figure, two capacitor elements 1d are connected to each other by the use of a silver paste through a cathode terminal 3c comprising a lead frame. Anode leads 2d are connected to opposite surfaces of an anode terminal 6 comprising a lead frame, respectively.

The present inventor developed a second conventional technique as a further improvement of the first conventional technique disclosed in Reference 1. The invention related to the second conventional technique is a subject of Japanese Patent Application No. 2003-106565 (not yet published). In the second conventional technique, a plurality of capacitor elements are connected in the following manner. A plate-like anode terminal is provided with at least one slit and divided by the slit into a plurality of parts, which are bent in a direction perpendicular to a plane of the anode terminal to form branched portions. Anode leads of the capacitor elements are individually connected to the branched portions of the anode terminal, respectively.

Referring to FIG. 3, connection of a plurality of capacitor elements disclosed in the second conventional technique will be described. In FIG. 3, two capacitor elements 1a and 1c are connected to each other. Anode leads 2a and 2c are extracted from the capacitor elements 1a and 1c, respectively. A cathode terminal 3d is interposed between the capacitor elements 1a and 1c. The anode leads 2a and 2c are connected to an anode terminal 6a.

As illustrated in FIG. 3, the anode terminal 6a has a plate-like shape and has an end portion divided by a slit into two parts, which are bent in a vertical direction in FIG. 3 to form branched portions. Each of the anode leads 2a and 2c is extracted from a side surface of each of the capacitor elements 1a and 1c and is positioned in the vicinity of an end portion of the side surface. The capacitor elements 1a and 1c are laminated so that the anode leads 2a and 2c are apart from each other.

The capacitor elements 1a and 1c are connected through the cathode terminal 3d. Therefore, a cathode layer (not shown) formed on a surface of each capacitor element is connected to the cathode terminal 3d. In Reference 2, the anode leads 2a and 2c are connected to the anode terminal 6a in the above-mentioned manner so that an interference between nuggets formed by welding or between fillets formed by brazing is avoided and the variation in bonding strength is suppressed.

However, in the techniques disclosed in the above-mentioned references, the capacitor elements are almost individually and separately bonded to the cathode-terminal. The surface conditions of the capacitor elements are nonuniform. Further, the amount of a conductive adhesive applied to bond the capacitor elements and the cathode terminal is not uniform. The two capacitor elements are individually connected to opposite surfaces of the cathode terminal by the conductive adhesive, respectively. Therefore, nonuniformity or variation tends to occur in bonding strength between the capacitor elements and the cathode terminal. For example, the bonding strength between one capacitor element and the cathode terminal may be within a managing standard while the bonding strength between the other capacitor element and the cathode terminal may not meet the standard. Consequently, the variation in bonding strength is difficult to suppress. This may result in variation in characteristic of a solid electrolytic capacitor as a finished product.

SUMMARY OF THE INVENTION

It is an object of this invention to provide a chip-type solid electrolytic capacitor which comprises a plurality of capacitor elements connected in parallel so as to meet the demand for an increase in capacitance and a decrease in ESR and which is capable of suppressing variation in bonding strength of the capacitor elements.

It is another object of this invention to provide a method of producing the above-mentioned chip-type solid electrolytic capacitor.

In order to achieve the above-mentioned objects, consideration was made of the shape of a cathode terminal interposed between bonding surfaces of capacitor elements. As a result, this invention has been made.

According to this invention, there is provided a chip-type solid electrolytic capacitor including a plurality of capacitor elements each of which has an anode member comprising a sintered body of a valve metal, a dielectric oxide layer, a cathode layer formed on a surface of the dielectric oxide layer, and an anode lead connected to the anode member, the capacitor-elements being electrically connected in parallel to one another, wherein the cathode layers are faced to each other through a plate-like cathode terminal, the cathode layers having confronting surfaces bonded to each other, the anode leads being connected to an anode terminal, the cathode terminal being provided with a through hole or a cutout formed at a portion to be brought into contact with the cathode layers.

According to this invention, the capacitor elements are bonded to each other by filling a bonding agent at an interface between each of the cathode layers and the cathode terminal and in the through hole or the cutout.

According to this invention, the anode leads corresponding to the capacitor elements are spaced from one another in a direction perpendicular to bonding surfaces of the capacitor elements.

According to this invention, the anode terminal has a plurality of branched portions at least equal in number to the number of the capacitor elements. The anode leads are spaced from one another in a direction perpendicular to bonding surfaces of the capacitor elements and are individually connected to the branched portions.

According to this invention, there is provided a method of producing a chip-type solid electrolytic capacitor, comprising the steps of forming a dielectric oxide layer and a cathode layer on an anode member obtained by sintering a valve metal, producing a capacitor element by connecting an anode lead to the anode member, laminating a plurality of the capacitor elements with the cathode layers faced to each other through a cathode terminal having at least one of a through hole and a cutout, filling a bonding agent at an interface between each of the cathode layers and the cathode terminal and in the through hole and/or the cutout, and bonding the capacitor elements and electrically connecting the capacitor elements in parallel.

According to this invention, the method further comprises the steps of arranging the anode leads corresponding to the capacitor elements so that the anode leads are spaced from one another in a direction perpendicular to bonding surfaces of the capacitor elements, and arranging the anode leads on the capacitor elements corresponding thereto so that planes containing center lines of the anode leads and perpendicular to the bonding surfaces do not overlap one another.

In the chip-type solid electrolytic capacitor according to this invention, the cathode terminal interposed between the bonding surfaces of the capacitor elements is provided with the through hole or the cutout formed at a portion to be brought into contact with the capacitor elements. With this structure, the bonding surfaces of the capacitor elements directly connected by the bonding agent are widened. As a consequence, the variation in bonding strength due to interposition of the cathode terminal is suppressed.

The through hole or the cutout formed in the cathode terminal exhibits the function of improving an anchor effect of bonding so as to achieve not only decrease in variation of the bonding strength but also improvement in bonding strength itself. Thus, this invention is effective in decreasing the variation in characteristic of the chip-type solid electrolytic capacitor and in improving the reliability.

DESCRIPTION OF THE PREFERRED EMBODIMENTS

Figure 1A:
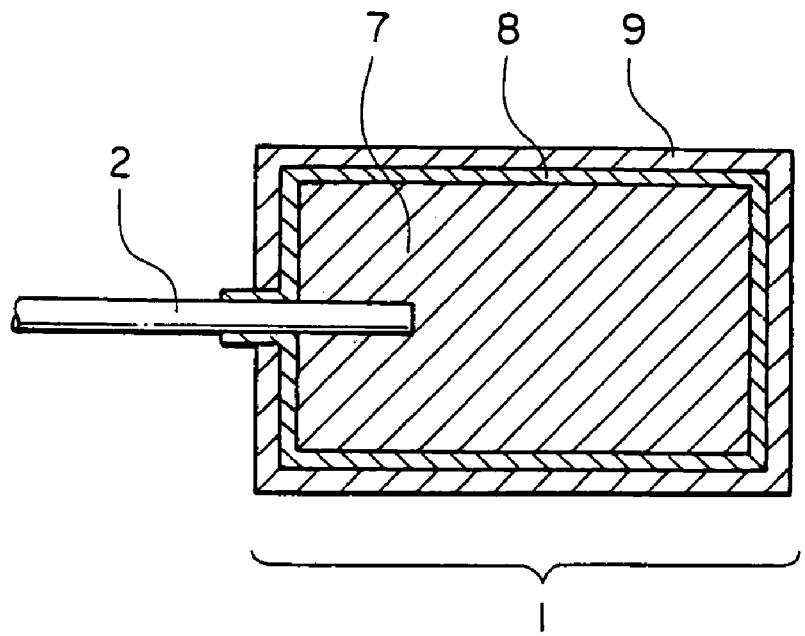
FIG. 1A is a sectional view of a capacitor element used in a typical conventional solid electrolytic capacitor.
Figure 1B:
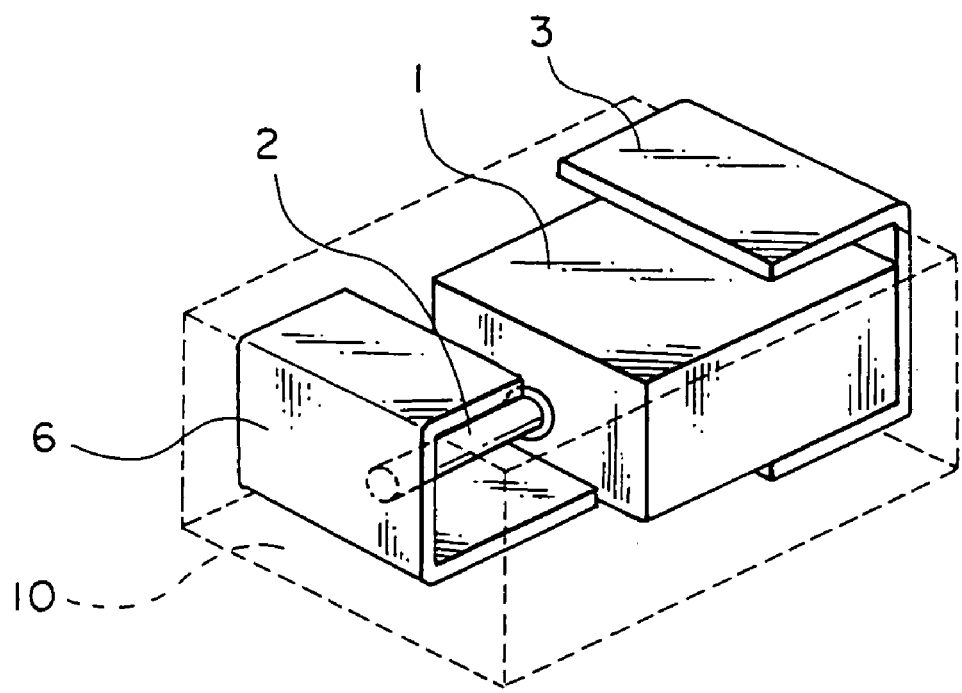
FIG. 1B is a perspective view of the solid electrolytic capacitor comprising the capacitor element illustrated in FIG. 1A.
Figure 2:
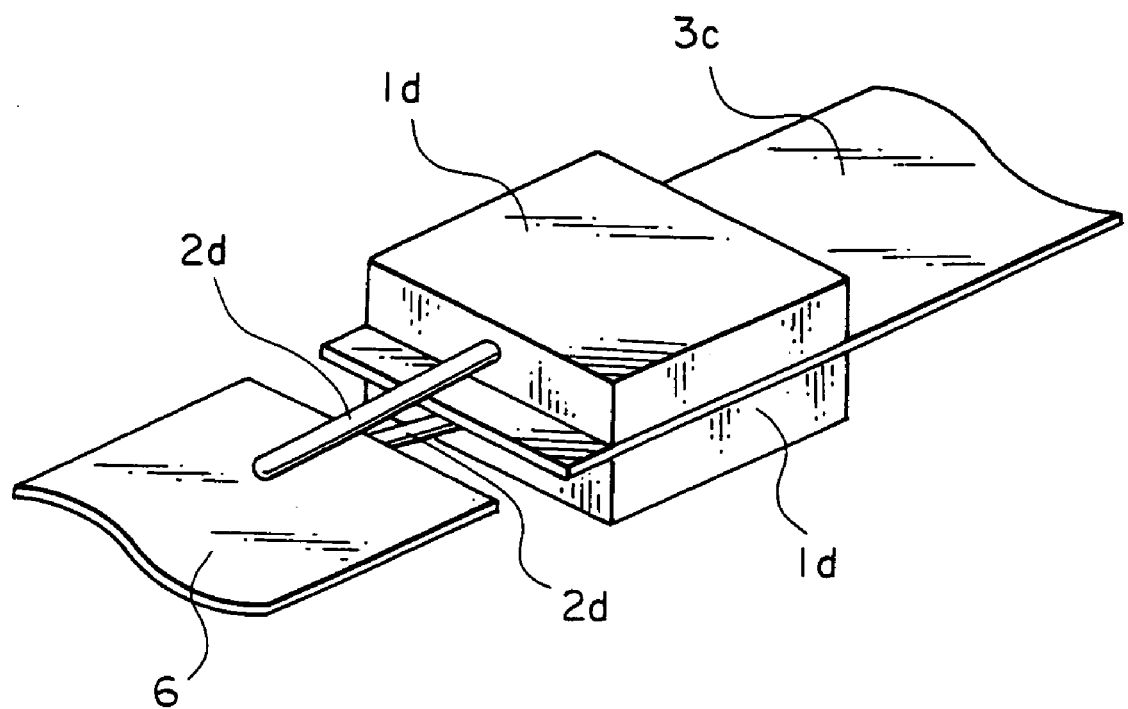
FIG. 2 is a perspective view showing a plurality of capacitor elements bonded to each other according to a first conventional technique.
Figure 3:
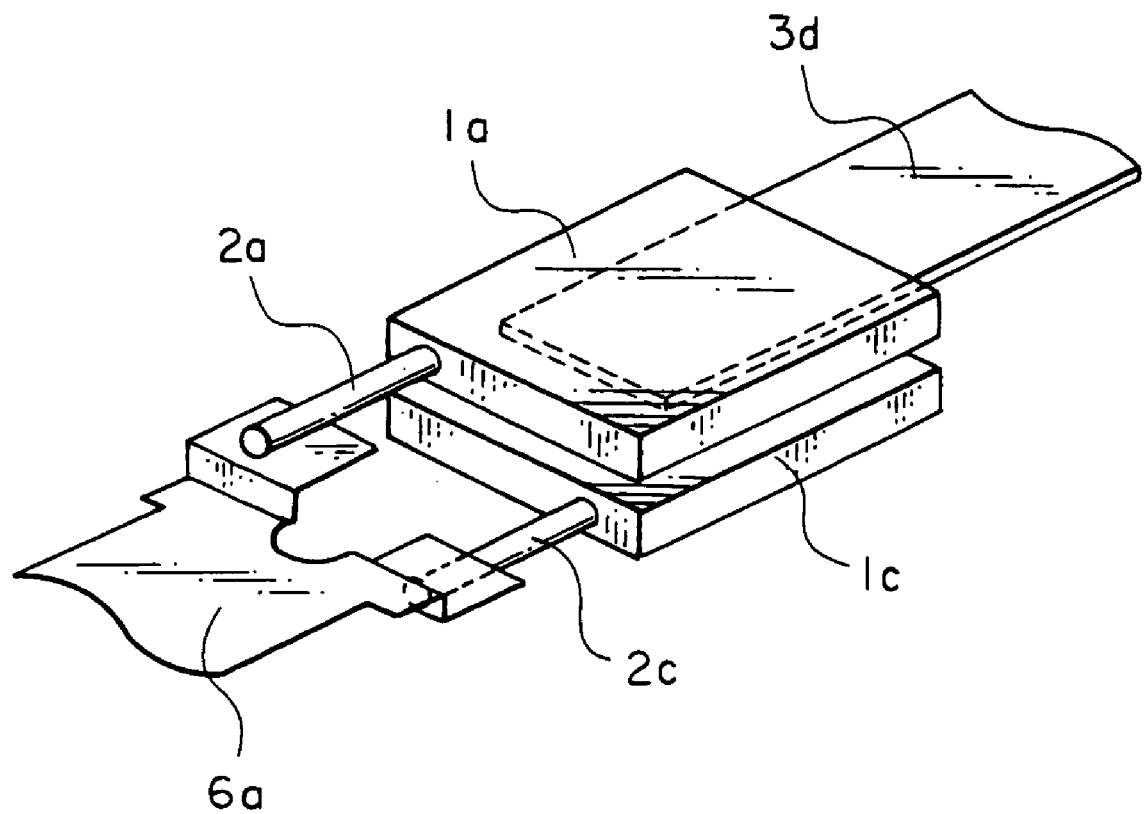
FIG. 3 is a perspective view showing a plurality of capacitor elements connected to each other according to a second conventional technique.

Now, embodiments of this invention will be described with reference to the drawing.

Referring to FIG. 4, a chip-type solid electrolytic capacitor according to one embodiment of this invention comprises two capacitor elements 1a and 1c. Anode leads 2a and 2c are extracted from the capacitor elements 1a and 1c and connected to an anode terminal 6a. A cathode terminal 3a is provided with a through hole 4a. The capacitor elements 1a and 1c are bonded to each other by the use of a bonding agent 5.

Each of the capacitor elements 1a and 1c is basically similar in structure to that illustrated in FIG. 1A. Herein, a typical method of producing the solid electrolytic capacitor will be described as regards the case where tantalum is used as a valve metal. At first, a tantalum wire is placed in a cavity of a die and tantalum powder is molded into a molded body. The molded body is sintered at a predetermined temperature. In the above-mentioned manner, anode members 7 having the anode leads 2a and 2c, respectively, are obtained. Each of the anode leads 2a and 2c is extracted from a side surface of the anode member 7 and is positioned at one end thereof. Sintering is carried out in a vacuum atmosphere.

Next, the anode member 7 is subjected to anodic oxidation in a portion except the tantalum wire to thereby form a tantalum oxide layer 8 in FIG. 1A. The anode member 7 with the tantalum oxide layer 8 formed thereon is dipped in a manganese nitrate solution to adhere manganese nitrate to the oxide layer 8. Consequently, manganese dioxide is formed by thermal decomposition. Subsequently, a cathode layer 9 made of graphite or silver is formed. Thus, each of the capacitor elements 1a and 1c is obtained.

If a conductive polymer, such as polythiophene or polypyrrole, is used as the cathode layer 9 instead of manganese dioxide, the ESR is easily decreased. Herein, tantalum is used as the valve metal. Alternatively, use may be made of niobium, aluminum, titanium, or the like.

The two capacitor elements 1a and 1c thus obtained are laminated through the cathode terminal 3a so that the anode leads 2a and 2c at eccentric positions are away from each other. The two capacitor elements 1a and 1c are bonded to each other by the use of the bonding agent 5, such as a solder or a conductive adhesive. The cathode terminal 3a is provided with the through hole 4a formed at a position where each of the capacitor elements 1a and 1c is contacted.

Figure 4A:
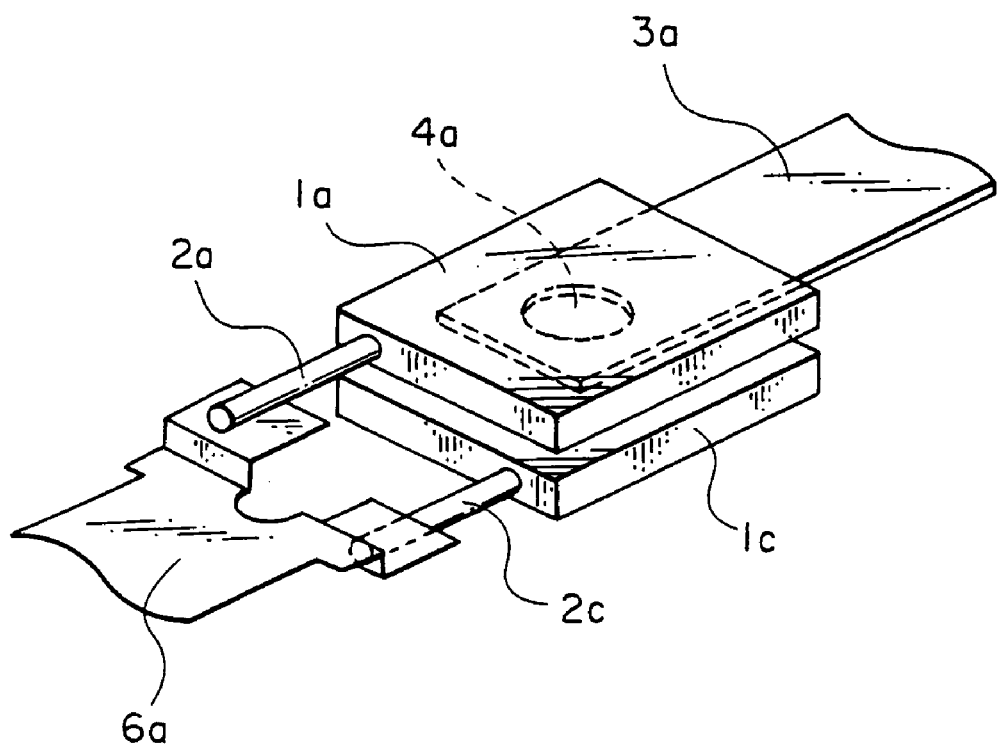
FIG. 4A is a perspective view showing a part of a chip-type solid electrolytic capacitor according to an embodiment of this invention in which two capacitor elements are bonded to each other.
Figure 4B:
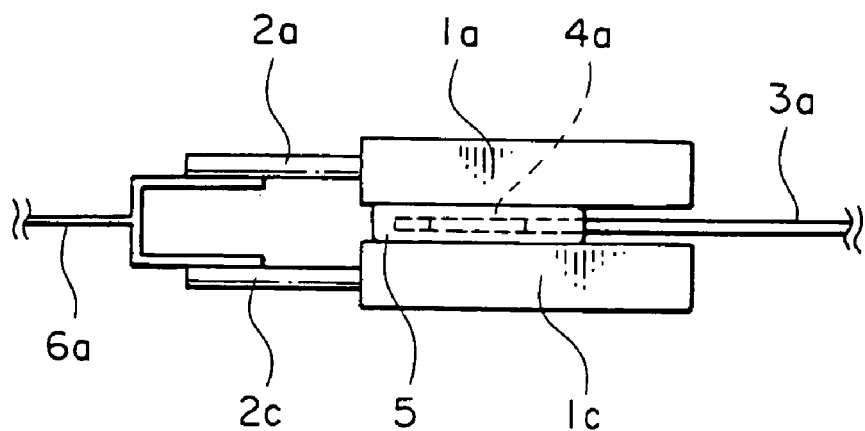
FIG. 4B is a side view of the chip-type solid electrolytic capacitor illustrated in FIG. 4A.

By the use of the cathode terminal 3a having he abovementioned structure, the bonding surfaces of the capacitor elements 1a and 1c are directly connected at the through hole 4a as illustrated in FIG. 4B. It is therefore possible to improve the bonding strength and to decrease the variation in bonding strength. The effect obtained by using the anode terminal 6a having branched portions as shown in FIG. 4A and by arranging the anode leads 2a and 2c as shown in FIG. 4A is exactly same as that described above.

Figure 7A:
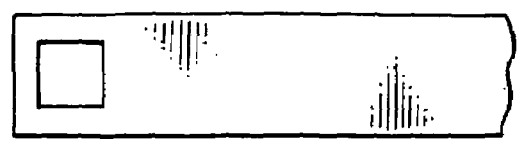
FIG. 7A is a view showing a rectangular through hole.
Figure 7B:
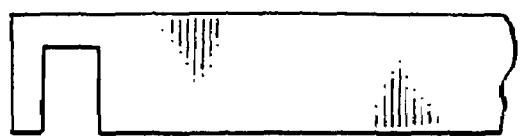
FIG. 7B is a view showing a rectangular cutout formed in a long side.
Figure 7C:
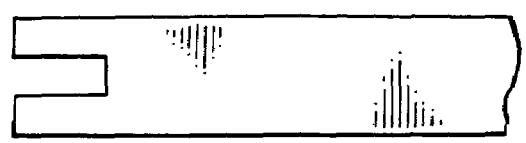
FIG. 7C is a view showing a rectangular cutout formed in a short side.
Figure 7D:
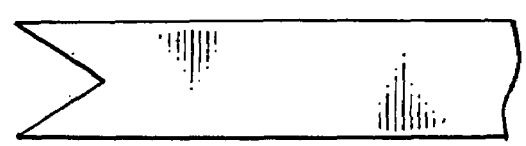
FIG. 7D is a view showing a triangular cutout formed in the short side.
Figure 7E:
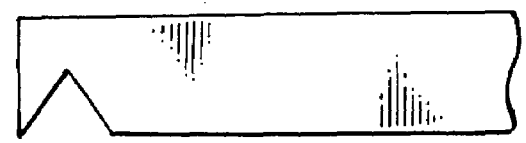
FIG. 7E is a view showing a triangular cutout formed in the short side.
Figure 7F:
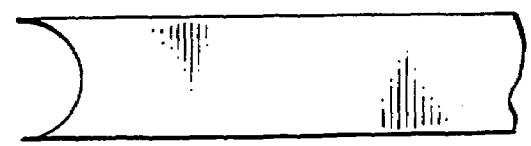
FIG. 7F is a view showing an arc-shaped cutout formed in the short side.
Figure 7G:
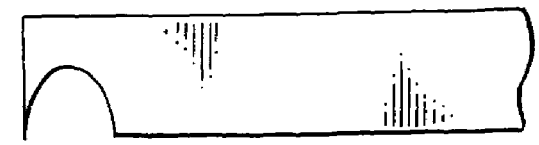
FIG. 7G is a view showing an arc-shaped cutout formed in the long side.

Herein, the cathode terminal 3a is provided with the through hole 4a having a circular shape. However, the shape of the through hole 4a is not limited to the circular shape. Instead of the through hole, a cutout may be formed. Further, both of the through hole and the cutout may be formed. Referring to FIGS. 7A through 7C, various shapes of the through hole and the cutout will be described. In FIG. 7A, the through hole has a rectangular shape. In FIG. 7B, the cutout of a rectangular shape is formed in a long side. In FIG. 7C, the cutout of a rectangular shape is formed in a short side. In FIG. 7D, the cutout of a triangular shape is formed in the short side. In FIG. 7E, the cutout of a triangular shape is formed in the long side. In FIG. 7F, the cutout of an arc shape is formed in the short side. In FIG. 7G, the cutout of an arc shape is formed in the long side. The through hole or the cutout may appropriately be designed depending upon the shape of the capacitor elements.

Figure 5A:
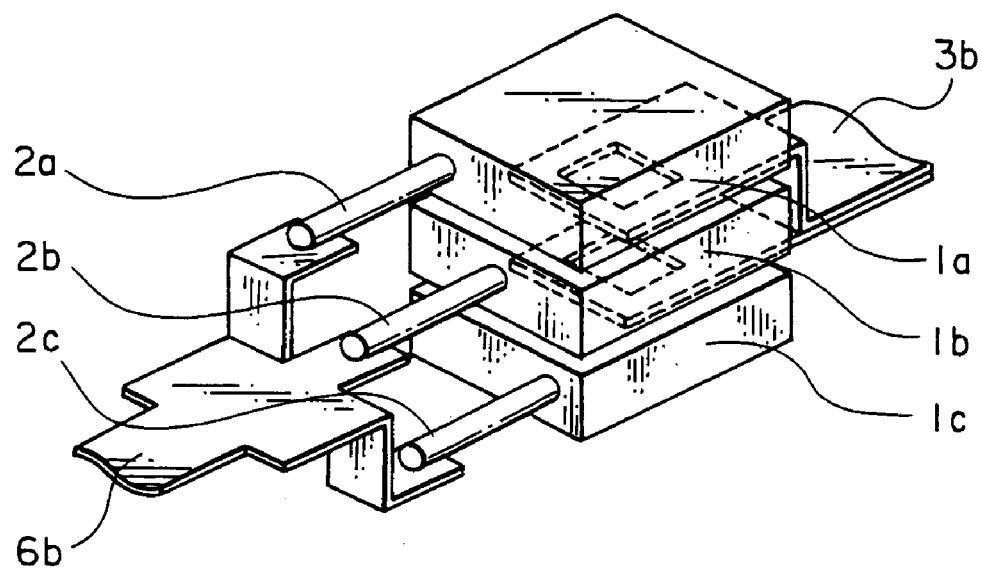
FIG. 5A is a perspective view of a part of a chip-type solid electrolytic capacitor comprising three capacitor elements according to another embodiment of this invention.
Figure 5B:
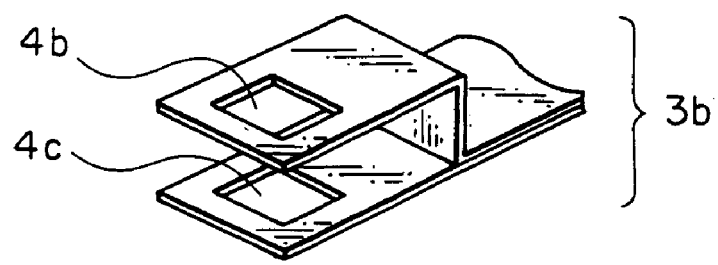
FIG. 5B is a perspective view of a cathode terminal of the chip-type solid electrolytic capacitor illustrated in FIG. 5A.

Referring to FIGS. 5A and 5B, a chip-type solid electrolytic capacitor according to another embodiment of this invention comprises three capacitor elements 1a, 1b, and 1c. As illustrated in FIGS. 5A and 5B, anode leads 2a, 2b, and 2c are attached to a leftmost position, a center position, and a rightmost position in the figure, respectively. When the three capacitor elements 1a, 1b, and 1c are laminated, the anode leads 2a, 2b, and 2c are spaced from one another in a direction perpendicular to bonding surfaces of the capacitor elements 1a, 1b, and 1c and is positioned so that three planes containing center lines of the anode leads 2a, 2b, and 2c and perpendicular to the bonding surfaces do not overlap. The three planes containing the center lines of the anode leads 2a, 2b, and 2c and perpendicular to the bonding surfaces are parallel to one another and substantially equally spaced.

An anode terminal 6b is divided by two slits into three parts. Among the three parts, the two parts at opposite ends are bent up and down in a vertical direction in the figure. Thus, three branched portions are formed. The anode leads 2a, 2b, and 2c are connected to the three branched portions of the anode terminal 6b, respectively, so that mutual interference by welding and brazing is suppressed.

Figure 5C:
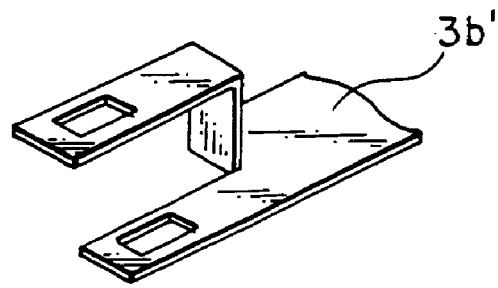
FIG. 5C is a perspective view of a modification of the cathode terminal.

On the other hand, as illustrated in FIG. 5B, the cathode terminal 3b is branched in the vertical direction in the figure. Branched portions are provided with rectangular through holes 4b and 4c, respectively. The bonding surfaces of the capacitor elements 1a and 1b are directly connected at the through hole 4b while the bonding surfaces of the capacitor elements 1b and 1c are directly connected at the through hole 4c. With this structure, it is possible to improve the bonding strength and to decrease the variation in bonding strength. Referring to FIG. 5C, a cathode terminal 3b' modified in shape is shown. Specifically, the cathode terminal 3b' has branched portions narrowed in width and can be formed from a single sheet of plate-like material.

In case where three or more capacitor elements are bonded, the cathode terminal need not have the branched portions as illustrated in FIG. 5B. The capacitor elements are provided with the cathode layers as outer layers. Therefore, if electrical connection among the cathode layers of the capacitor elements to be bonded is assured by the use of a conductive bonding agent, it is relatively easy to integrally combine the cathode layers. Then, the cathode terminal can be attached to the cathode layers integrally combined.

Figure 6:
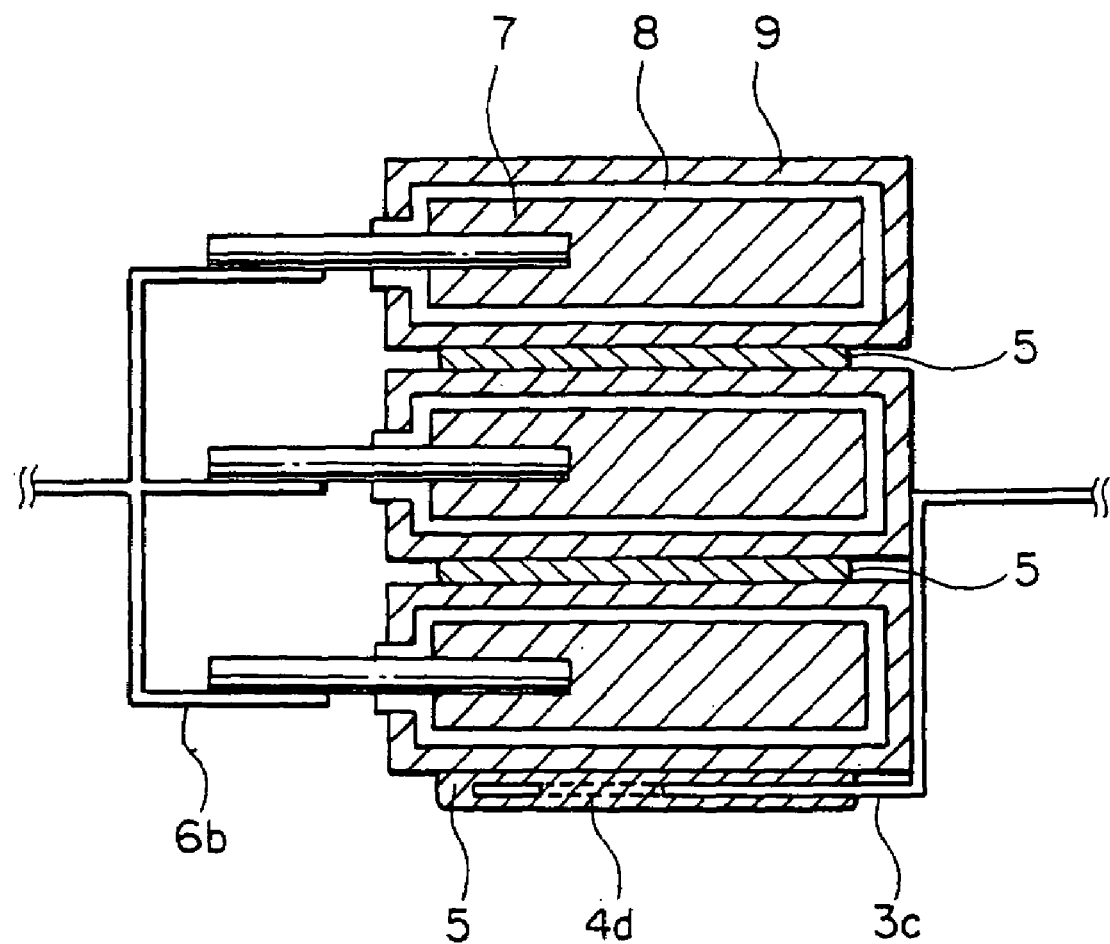
FIG. 6 is a view showing an example where cathode layers are connected by a cathode terminal without any branch.

Referring to FIG. 6, cathode layers 9 of capacitor elements are bonded by a conductive bonding agent 5 and a cathode terminal 3c without any branch is connected. The cathode terminal 3c has a through hole 4d.

As illustrated in FIG. 6, the cathode layers 9 of the capacitor elements are electrically connected by the bonding agent 5. Therefore, the cathode terminal 3c need not be branched and is simply connected to a bottom surface of the lowermost capacitor element in FIG. 6. Alternatively, the cathode terminal 3c may be interposed between the intermediate capacitor element and the lowermost capacitor element. In this case also, the through hole 4d formed in the cathode terminal 3c provides an anchor effect in bonding between the cathode layer 9 and the cathode terminal 3c. Thus, the reliability of connection can be improved.

In order to verify the effect of improving the bonding strength, the experimental test was carried out as follows. Preparation was made of 100 samples of the solid electrolytic capacitor comprising two capacitor elements bonded to each other as illustrated in FIG. 4A and 100 comparative samples similar in structure to that illustrated in FIG. 4A except that the cathode terminal has no through hole or no cutout. For these samples, the average and the standard deviation of the bonding strength were obtained. As a result, those samples in which the cathode terminal has a through hole, i.e., the two capacitor elements are bonded by the method of this invention achieves 35% increase in average and 41% decrease in standard deviation, as compared with the samples without the through hole.

As described above, according to this invention, it is possible, in the chip-type solid electrolytic capacitor comprising a plurality of capacitor elements connected in parallel, to suppress the variation in bonding strength of the capacitor elements, to increase the average bonding strength, to reduce the variation in characteristic, and to assure high reliability.

Although the present invention has been shown and described in conjunction with a few preferred embodiments thereof, it will readily be understood by those skilled in the art that the present invention is not limited to the foregoing description but may be changed and modified in various other manners without departing from the spirit and scope of the present invention as set forth in the appended claims.

What is claimed is:

1. A method of producing a chip-type solid electrolytic capacitor, comprising:

produce a plurality of capacitor elements, each one of the capacitor elements being produced by: (i) obtaining an anode member by sintering a valve metal such that an anode lead is connected to the anode member, (ii) forming a dielectric oxide layer on the anode member, and (iii) forming a cathode layer on the dielectric oxide layer;

laminating the plurality of capacitor elements with at least one cathode terminal positioned between two capacitor elements such that the cathode layers of the two capacitor elements face each other via the cathode terminal, said cathode terminal having at least one of a through hole and a cutout formed therein;

filling a bonding agent at an interface between each of the cathode layers and the cathode terminal and in said at least one of the through hole and the cutout, so as to bond the capacitor elements together; and electrically connecting the capacitor elements in parallel.

2. A method according to claim 1, wherein the capacitor elements are produced and laminated such that the respective anode leads of the capacitor elements are spaced from one another in a direction perpendicular to bonding surfaces of the capacitor elements.

3. A method according to claim 1, wherein the through hole has one of: a circular shape, a rectangular shape, and another polygonal shape.

4. A method according to claim 2, wherein the through hole has one of: a circular shape, a rectangular shape, and another polygonal shape.

* * * * *